(12) United States Patent
Ware et al.

(10) Patent No.: US 9,355,021 B2
(45) Date of Patent: May 31, 2016

(54) CROSS-THREADED MEMORY SYSTEM

(71) Applicant: Rambus Inc., Sunnyvale, CA (US)

(72) Inventors: Frederick A. Ware, Los Altos Hills, CA (US); Kishore Kasamsetty, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/909,339

(22) Filed: Jun. 4, 2013

(65) Prior Publication Data
US 2013/0339631 A1 Dec. 19, 2013

Related U.S. Application Data

(63) Continuation of application No. 12/828,526, filed on Jul. 1, 2010, now Pat. No. 8,510,495, which is a continuation of application No. 11/460,582, filed on Jul. 27, 2006, now Pat. No. 7,769,942.

(51) Int. Cl.
*G06F 12/00* (2006.01)
*G06F 12/02* (2006.01)
*G06F 13/16* (2006.01)

(52) U.S. Cl.
CPC ............... *G06F 12/00* (2013.01); *G06F 12/02* (2013.01); *G06F 13/1657* (2013.01)

(58) Field of Classification Search
CPC ...... G06F 12/00; G06F 12/02; G06F 13/1657
USPC ................................. 710/317; 711/150, 168
See application file for complete search history.

(56) References Cited

U.S. PATENT DOCUMENTS

| | | | |
|---|---|---|---|
| 4,796,232 A * | 1/1989 | House | 365/189.03 |
| 5,142,638 A | 8/1992 | Schiffleger | |
| 5,519,837 A | 5/1996 | Tran | |
| 5,625,796 A | 4/1997 | Kaczmarczyk | |
| 5,732,041 A | 3/1998 | Joffe | |
| 5,832,303 A | 11/1998 | Murase et al. | |
| 5,907,862 A | 5/1999 | Smalley | |
| 5,923,839 A | 7/1999 | Munetoh et al. | |
| 6,184,906 B1 | 2/2001 | Wang et al. | |
| 6,226,706 B1 | 5/2001 | Kim | |
| 6,240,040 B1 | 5/2001 | Akaogi et al. | |

(Continued)

FOREIGN PATENT DOCUMENTS

| | | |
|---|---|---|
| EP | 0814410 | 12/1997 |
| WO | WO-95/05635 | 2/1995 |

OTHER PUBLICATIONS

Amendment Under Article 19 submitted Aug. 30, 2010 re PCT/US2010/022986 with Replacement Sheets 42, 45, 46, 48-52, and 61-65, Including the Amendments to the Claims. 15 pages.

(Continued)

*Primary Examiner* — Nimesh G Patel
(74) *Attorney, Agent, or Firm* — Lance Kreisman; Peninsula Patent Group

(57) ABSTRACT

In a data processing system, a buffer integrated-circuit (IC) device includes multiple control interfaces, multiple memory interfaces and switching circuitry to couple each of the control interfaces concurrently to a respective one of the memory interfaces in accordance with a path selection value. A plurality of requestor IC devices are coupled respectively to the control interfaces, and a plurality of memory IC devices are coupled respectively to the memory interfaces.

19 Claims, 10 Drawing Sheets

(56) References Cited

U.S. PATENT DOCUMENTS

| | | |
|---|---|---|
| 6,282,583 B1 | 8/2001 | Pincus et al. |
| 6,308,219 B1 * | 10/2001 | Hughes .................. 709/238 |
| 6,628,662 B1 | 9/2003 | Blackmon et al. |
| 6,717,834 B2 | 4/2004 | Zagorianakos et al. |
| 6,797,538 B2 * | 9/2004 | Wallace .................. 438/109 |
| 6,799,252 B1 | 9/2004 | Bauman |
| 7,058,063 B1 | 6/2006 | Cavendish |
| 7,249,207 B2 | 7/2007 | Check et al. |
| 7,269,158 B2 | 9/2007 | Francois et al. |
| 7,349,285 B2 | 3/2008 | Balasubramanian et al. |
| 2002/0075845 A1 | 6/2002 | Mullaney et al. |
| 2003/0135291 A1 * | 7/2003 | DeLano .................. 700/53 |
| 2003/0155659 A1 * | 8/2003 | Verma et al. .................. 257/777 |
| 2004/0034749 A1 * | 2/2004 | Jeddeloh .................. 711/154 |
| 2004/0259291 A1 * | 12/2004 | Takiar .................. 438/113 |
| 2005/0021884 A1 | 1/2005 | Jeddeloh |
| 2005/0050255 A1 | 3/2005 | Jeddeloh |
| 2005/0102444 A1 | 5/2005 | Cruz |
| 2005/0172066 A1 | 8/2005 | Spencer et al. |
| 2006/0004976 A1 | 1/2006 | Rader |
| 2006/0117155 A1 | 6/2006 | Ware et al. |
| 2006/0171239 A1 | 8/2006 | Balasubramanian et al. |
| 2006/0236208 A1 | 10/2006 | Suzuki et al. |
| 2006/0248247 A1 * | 11/2006 | Stewart et al. .................. 710/107 |
| 2007/0025173 A1 * | 2/2007 | Cullum et al. .................. 365/230.03 |
| 2007/0069390 A1 * | 3/2007 | Chen et al. .................. 257/777 |
| 2007/0091104 A1 * | 4/2007 | Singh et al. .................. 345/531 |
| 2007/0153588 A1 * | 7/2007 | Janzen .................. 365/189.03 |
| 2007/0208901 A1 * | 9/2007 | Purcell et al. .................. 710/317 |
| 2007/0260841 A1 | 11/2007 | Hampel et al. |
| 2008/0001303 A1 * | 1/2008 | Yu et al. .................. 257/777 |
| 2008/0028127 A1 | 1/2008 | Ware et al. |
| 2009/0075607 A1 * | 3/2009 | Khoury .................. 455/127.1 |
| 2011/0110380 A1 | 5/2011 | Muller et al. |

OTHER PUBLICATIONS

Final Office Action dated Jun. 22, 2011 re U.S. Appl. No. 12/828,526. 6 pages.
International Preliminary Report on Patentability (Chapter II) dated Oct. 31, 2011 re International Application No. PCT/US10/22986. 34 pages.
International Search Report and Written Opinion dated Jun. 30, 2010 in International Application No. PCT/US2010/022986. 14 pages.
International Search Report and Written Opinion dated Apr. 16, 2008 in International Application No. PCT/US2007/074513. 11 pages.
PCT Response dated Jan. 19, 2011 to the Communication in Cases for which no Other Form is Applicable mailed on Dec. 20, 2010 re International Application No. PCT/US10/22986. 27 pages.
Ware, Frederick, U.S. Appl. No. 12/828,526, filed Jul. 1, 2010, re Advisory Action Before the Filing of an Appeal Brief dated Oct. 6, 2011. 3 pages.
Ware, Frederick, U.S. Appl. No. 12/828,526, filed Jul. 1, 2010, re Notice of Appeal dated Oct. 21, 2011. 1 page.
Ware, Frederick, U.S. Appl. No. 11/460,582, filed Jul. 27, 2006, re Office Action mailed Nov. 30, 2009. 14 pages.
Ware, Frederick, U.S. Appl. No. 12/828,526, filed Jul. 1, 2010, re Appeal Brief filed Jan. 20, 2012. 26 pages.
Ware, Frederick, U.S. Appl. No. 12/828,526, filed Jul. 1, 2010, re Office Action dated Dec. 28, 2010. 6 pages.
Ware, Frederick, U.S. Appl. No. 12/828,526, filed Jul. 1, 2010, re Response dated Mar. 2, 2011 to the Office Action mailed Dec. 28, 2010. 11 pages.

* cited by examiner

Data Read Timing

Data Write Timing

CROSS-THREADED MEMORY SYSTEM

CROSS-REFERENCE TO RELATED APPLICATIONS

This Application is a continuation of U.S. patent application Ser. No. 12/828,526, filed Jul. 1, 2010, entitled "Cross-Threaded Memory System", by inventors Frederick A. Ware et al., which is a continuation of U.S. patent application Ser. No. 11/460,582, filed Jul. 27, 2006, entitled "Cross-Threaded Memory System", by inventors Frederick A. Ware et al., now U.S. Pat. No. 7,769,942, issued Aug. 3, 2010, each of which is incorporated herein by reference in its entirety for all purposes.

TECHNICAL FIELD

The disclosure herein relates to data storage and retrieval systems.

BACKGROUND

Memory bandwidth is a key factor in the performance of modern gaming systems and has increased with each new generation largely through increases in signaling rate and input/output (I/O) pins. Unfortunately, pin count and signaling rate are beginning to approach physical limits so that further increases must overcome difficult challenges and will likely be unable to keep pace with the increased memory bandwidth demanded by next-generation systems.

One alternative to increasing pin count or signaling rate is to add additional graphics controllers to achieve increased parallel processing within a graphics pipeline. Unfortunately, many of the data structures that need to be accessed to carry out the functions within the graphics pipeline tend to be shared so that, even if multiple graphics controllers are provided, a performance penalty is typically incurred each time two controllers contend for a shared data structure, as one of the controllers generally must wait for the other to finish accessing the memory in which the shared data structure is stored.

BRIEF DESCRIPTION OF THE DRAWINGS

The disclosure herein is illustrated by way of example, and not by way of limitation, in the figures of the accompanying drawings and in which like reference numerals refer to similar elements and in which.

DETAILED DESCRIPTION

A memory subsystem having one or more integrated-circuit (IC) devices that enable multiple memory access requestors to concurrently access a set of shared memory devices is disclosed in various embodiments. In one embodiment, each such IC device, referred to herein as a buffer IC or buffer device, may include circuitry to switchably couple any one of the memory access requestors to any one of the memory devices and to concurrently couple each of the other memory access requestors to others of the memory devices in accordance with a channel select signal. By this arrangement, all the memory access requestors may concurrently access the collective memory devices during a given switching interval, with each requestor accessing a respective one of the memory devices. At the conclusion of the switching interval, the channel select signal may be changed to establish a different switched connection between requestors and memory devices for the subsequent switching interval. In one embodiment, for example, the channel select signal may be stepped through a repeating sequence of values so that each of the memory access requestors is provided with time-multiplexed access to each of the memory devices in round-robin fashion. By this operation, for example, multiple graphics controllers may be operated in parallel to carry out pipelined graphics processing operations using a shared memory structure and without requiring the controllers to become idle or otherwise wait while other controllers finish accessing a shared memory device. Viewing each sequence of accesses from a given controller to a given memory device as a memory access thread, the concurrent accesses to the various memory devices by different controllers are referred to herein as cross-threads, and the overall memory system formed by the multiple controllers, one or more buffer devices and memory devices is referred to herein as a cross-threaded memory system.

In one embodiment, each of the buffer devices may include multiple control interfaces and multiple memory interfaces. When configured in a data processing system such as a gaming console or other memory-intensive system, each of the control interfaces may be coupled to a respective memory access requestor and each of the memory interfaces may be coupled to a respective memory device. More specifically, in a particular graphics processing embodiment, each of the memory access requestors may be a graphics controller or processor and may be implemented on a dedicated integrated circuit die or on a die that may include one or more other graphics controllers, and each of the memory devices may be an integrated circuit die or group of integrated circuit dice.

Further, the integrated circuit dice on which the memory devices and buffer devices are formed may be disposed within a multiple-die IC package, including, without limitation, a system-in-package (SIP), package-in-package (PIP), package-on-package (POP) arrangement.

Figure 1:
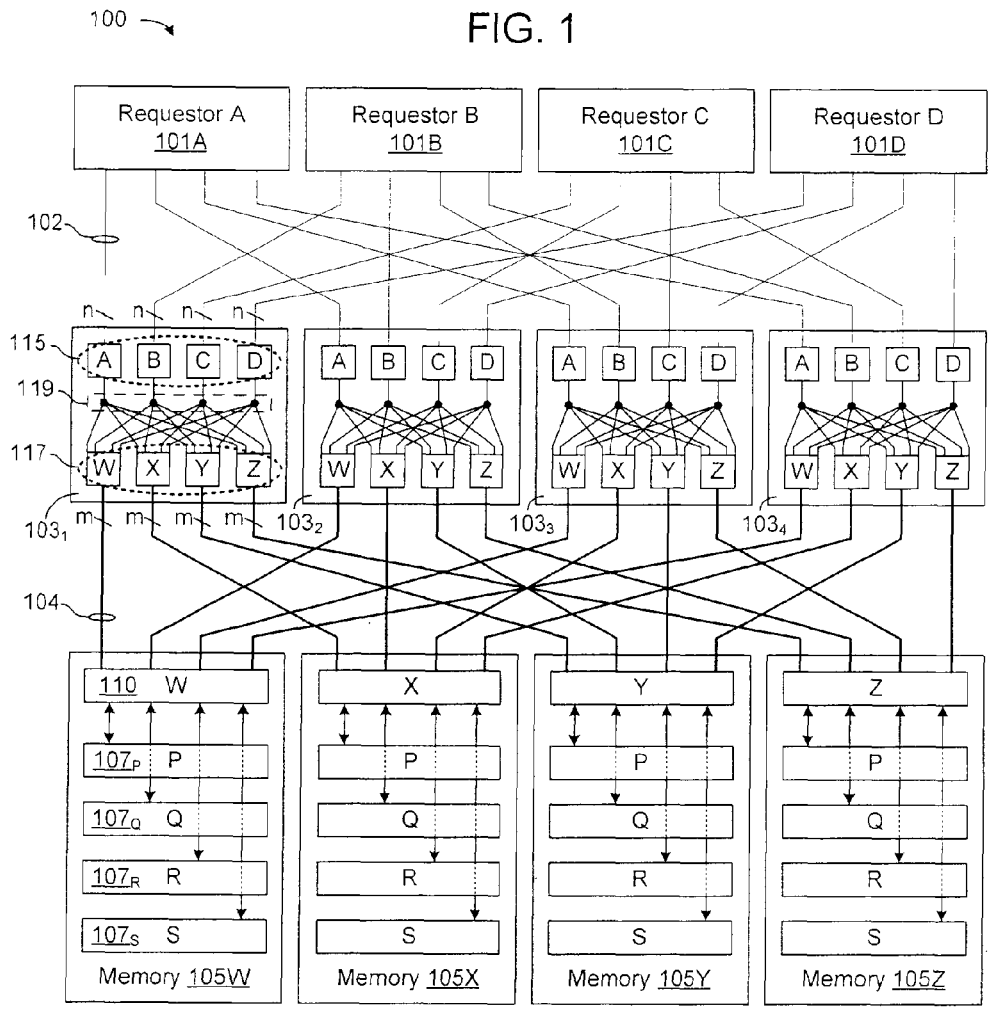
FIG. 1 illustrates an embodiment of a cross-threaded memory system.

FIG. 1 illustrates an embodiment of a cross-threaded memory system 100 that may include multiple memory access requestors 101A-101D, buffer devices $103_1$-$103_4$ and memory devices 105W-105Z. The memory access requestors (collectively, 101) may be special or general purpose processors, such as microprocessors, graphics processors, graphics controllers, microcontrollers and the like, or more task-specific devices such as direct-memory-access (DMA) controllers, application-specific integrated circuits (ASICs), or any other type of memory access requestor, including combinations of different types of memory access requestors. In the embodiment shown, each of the buffer devices 103 may be implemented in a respective integrated circuit die, though two or more (or all) of the buffer devices may be combined within a single integrated circuit die. Also, as discussed in further detail below, the buffer devices 103, memory devices 105 and/or memory access requestors 101 may be combined in a multi-chip package including, without limitation, a system-in-package (SIP), package-on-package (POP), package-in-package (PIP) or the like.

Each of the buffer devices 103 may include multiple control interfaces 115 (designated A-D) each coupled to a respective one of the requestors 101A-101D via an n-conductor signal path 102, and also multiple memory interfaces 117 each coupled to a respective one of the memory devices 105W-105Z via an m-conductor signaling path 104. In one embodiment, the control-side signaling paths 102 (i.e., the signaling paths between the buffer ICs 103 and the memory access requestors 101) may be each formed by one or more signaling links (which may each include a single conductor in a single-ended signaling arrangement or two conductors in a differential signaling arrangement) that are fewer in number, but operated at higher signaling rate, than the signaling links which form the memory-side signaling paths 104 (i.e., the signaling paths between the buffer ICs 103 and the memory devices 105), thus enabling narrower but faster control-side signaling paths 102 to match the bandwidth of wider, but slower memory-side signaling paths 104. The path width (i.e., number of constituent links within a given signaling path) and signaling rate relationship may be reversed in alternative embodiments (i.e., narrower but faster memory-side signaling path), or may be substantially balanced. Also, the bandwidth of the control-side and memory-side signaling paths may not exactly match, thus providing headroom to convey error information or other signaling control and/or system control information in otherwise unused bandwidth.

Each of the buffer devices 103 may additionally include a switching circuit 119 or multiplexing circuit disposed between the control interfaces and memory interfaces to enable flexible, switched interconnection of the control interfaces 115 and memory interfaces 117. More specifically, depending on the state of a channel select signal (not specifically shown in FIG. 1), the switching circuit 119 may couple any one of the control interfaces 115 exclusively to any one of the memory interfaces 117, and concurrently (i.e., at least partly overlapping in time) couple each of the other control interfaces exclusively to another of the memory interfaces. For example, during a first switching interval, individual control interfaces A, B, C and D (i.e., within control interfaces 115) may be switchably coupled to memory interfaces W, X Y and Z, respectively, in response to a first state of the channel select signal, while in a subsequent interval, the channel select signal may be changed so that control interfaces A, B, C and D are switchably coupled to memory interfaces X, Y, Z and W, respectively. Other interconnection patterns are possible and, as discussed below, when the channel select signal is sequenced through a repeating pattern in which each control interface is coupled one-after-another to each of the memory interfaces, concurrent, round-robin access to each of the memory devices 105W-105Z may be provided to each of the memory access requestors 101A-101D, thereby providing each memory access requestor 101 with complete and continuous access to the shared memory formed by memory devices 105.

Though memory devices 105 may be implemented using virtually any type of storage technology, in the embodiment of FIG. 1 and other embodiments described below, the memory devices 105 may be dynamic random access memory (DRAM) devices (including, for example and without limitation, DRAM devices of various data rates (SDR, DDR, etc.), graphics memory devices (e.g., GDDR), XDR memory devices, micro-threading memory devices, for example as described in U.S. Patent Application Publication No. US2006/0117155 A1, and so forth) having multiple storage banks (referred to herein simply as "banks") and that exhibit a minimum time delay (tRR) between successive accesses to rows within different banks and a minimum time delay (tRC) between successive accesses to different rows within the same bank. A minimum time delay (tCC) may also be imposed between successive accesses to different columns of data within an activated row, where an activated row is one whose contents have been retrieved from an address selected row of DRAM storage cells and latched within a bank of sense amplifiers. In the particular embodiment of FIG. 1, each of the four memory devices 105W-105Z may include a memory core formed by four address-selectable memory banks 107P-107S (the banks being designated P, Q, R and S) and control logic 110 to store data within and retrieve data from the memory core in response to memory access commands. In the particular embodiment shown, the control logic 110 may include multiple data I/O ports coupled to respective memory-side data paths 104 and thus may receive slices of data (via each data I/O port) that collectively form a write data word to be stored in a memory write transaction or to output slices of data that collectively form a read data word in a memory read transaction. One or more separate control ports may be provided within each memory device 105 for receipt of control information (e.g., commands or requests indicating the requested operation and, at least in the case of a memory read or write, one or more address values that specify the bank, row and/or column location to which the operation is directed), or the control information may be time-multiplexed onto one or more of the data paths 104 and received via the data I/O ports. In a memory read operation, the control logic 110 may activate an address-specified row of storage cells within an address-specified bank (i.e., in an activate or activation operation), if the row has not already been activated, then may retrieve read data through one or more read accesses directed to address-specified column locations within the activated row of an address-specified bank. The read data may be output to the buffer devices $103_1$-$103_4$ in respective slices (i.e., portions of the entire read data word) via data paths 104, and the buffer devices $103_1$-$103_4$, in turn, may forward the read data to a selected one of memory access requestors 101A-101D via switching circuits 119 and controller interfaces 115. In a memory write operation, the control logic 110 may also activate an address-specified row of storage cells within an address-specified bank, if not already activated, then may perform one or more write accesses directed to address-specified column locations within the activated row for an address-specified bank to store a write data word received via data paths 104.

Figure 2:
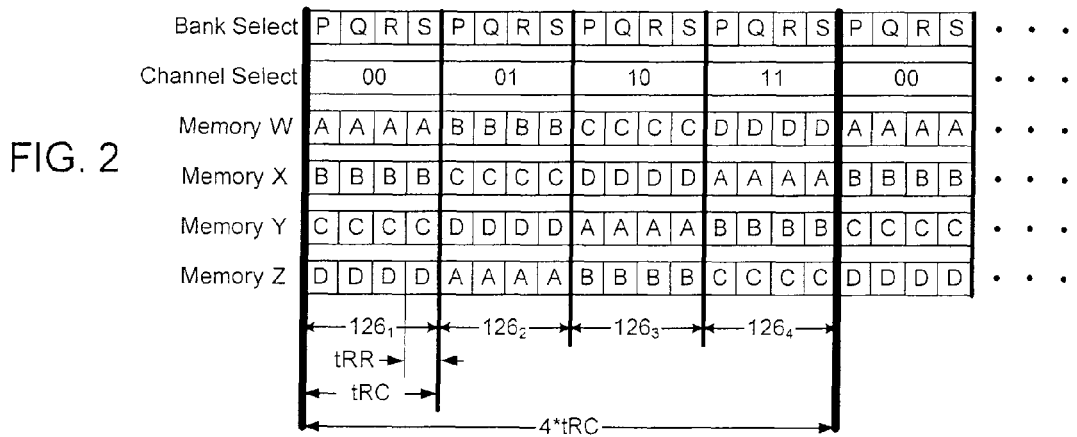
FIG. 2 illustrates the timing of a round-robin memory access scheme that may be applied within the cross-threaded memory system of FIG. 1.

FIG. 2 illustrates the timing of a round-robin memory access scheme that may be applied within the cross-threaded memory system 100 of FIG. 1. A two-bit channel select signal ("Channel Select") may be provided to each of the buffer devices 103 and may be repeatedly stepped through states '00', '01', '10' and '11' in respective tRC intervals, $126_1$-$126_4$. By this arrangement, each of the buffer devices 103 may couple control interface 115-A (i.e., interface A within control interfaces 115) to memory interface 117-W (i.e., interface W within memory interfaces 117) during interval $126_1$ so that each of the four data I/O ports within memory 105W may be switchably coupled to requestor 101A via a respective one of the buffer devices $103_1$-$103_4$. Consequently, memory device 105W may be accessed (i.e., through each of its four data I/O ports in parallel) by memory access requestor 101A during each of four tRR intervals that make up tRC interval $126_1$ as indicated by the designation 'A', 'A', 'A', 'A' in the 'Memory W' access sequence of FIG. 2. During the same tRC interval ($126_1$) memory access requestor 101B may be switchably coupled to memory device 105X via control interfaces 115-B and memory interfaces 117-X within the four buffer devices $103_1$-$103_4$; memory access requestor 101C may be switchably coupled to memory device 105Y via control interfaces 115-C; and memory interfaces 117-Y, and memory access requestor 101D may be switchably coupled to memory device 105Z via control interfaces 115-D and memory interfaces 117-Z. In the subsequent switching interval (i.e., tRC interval $126_2$), the channel select signal may be changed (i.e., stepped or sequenced) to state '01' to switchably couple memory access requestors 101A, B, C and D to memory devices 105Z, W, X and Y, respectively. In the following switching interval (tRC interval $126_3$), the channel select signal may be changed to state '10' to switchably couple memory access requestors 101A, B, C and D to memory devices 105Y, Z, W and X, respectively, and in a final switching interval (tRC interval $126_4$) before the channel select signal rolls over to repeat the channel selection sequence, the channel select signal may be changed to state '11' to couple memory access requestors 101A, B, C and D to memory devices 105X, Y, Z and W, respectively.

In the particular embodiment of FIGS. 1 and 2, four different channel select values may be applied to enable each of the four memory access requestors 101A-101D to access the four memory devices 105W-105Z during a respective tRC interval and, thus, the total time to sequence through each possible interconnection pattern is 4*tRC (where '*' denotes multiplication), a time interval referred to herein as a switch-pattern cycle time.

Still referring to FIG. 2, in one embodiment, a bank-select value (or bank address) may be sequenced through each of four possible bank selection values during each switching interval 126 (i.e., each tRC interval) to enable each memory access requestor 101 to access each memory bank 107 of the selected memory device 105 in a respective tRR interval 126. Thus, during the four tRR intervals that constitute switching interval $126_1$, memory access requestor 101A may be enabled to access memory banks 107P, 107Q, 107R and 107S, respectively, within memory device 105W, and memory access requestors 101B, 101C and 101D are likewise (and concurrently) enabled to access memory banks 107P, 107Q, 107R and 107S within memory devices 105X, 105Y and 105Z, respectively. Other bank selection sequences may be applied in alternative embodiments, particularly where more or fewer banks 107 are provided within each memory device 105.

Also, while each of the multi-bank memory devices 105 has been described as being implemented by a single IC, multiple memory ICs may be accessed as a unit, referred to herein as a memory rank, with each memory device within the memory rank contributing a respective subset of the data I/O ports that form the total collection of data I/O ports shown for a given memory device 105.

Figure 3:
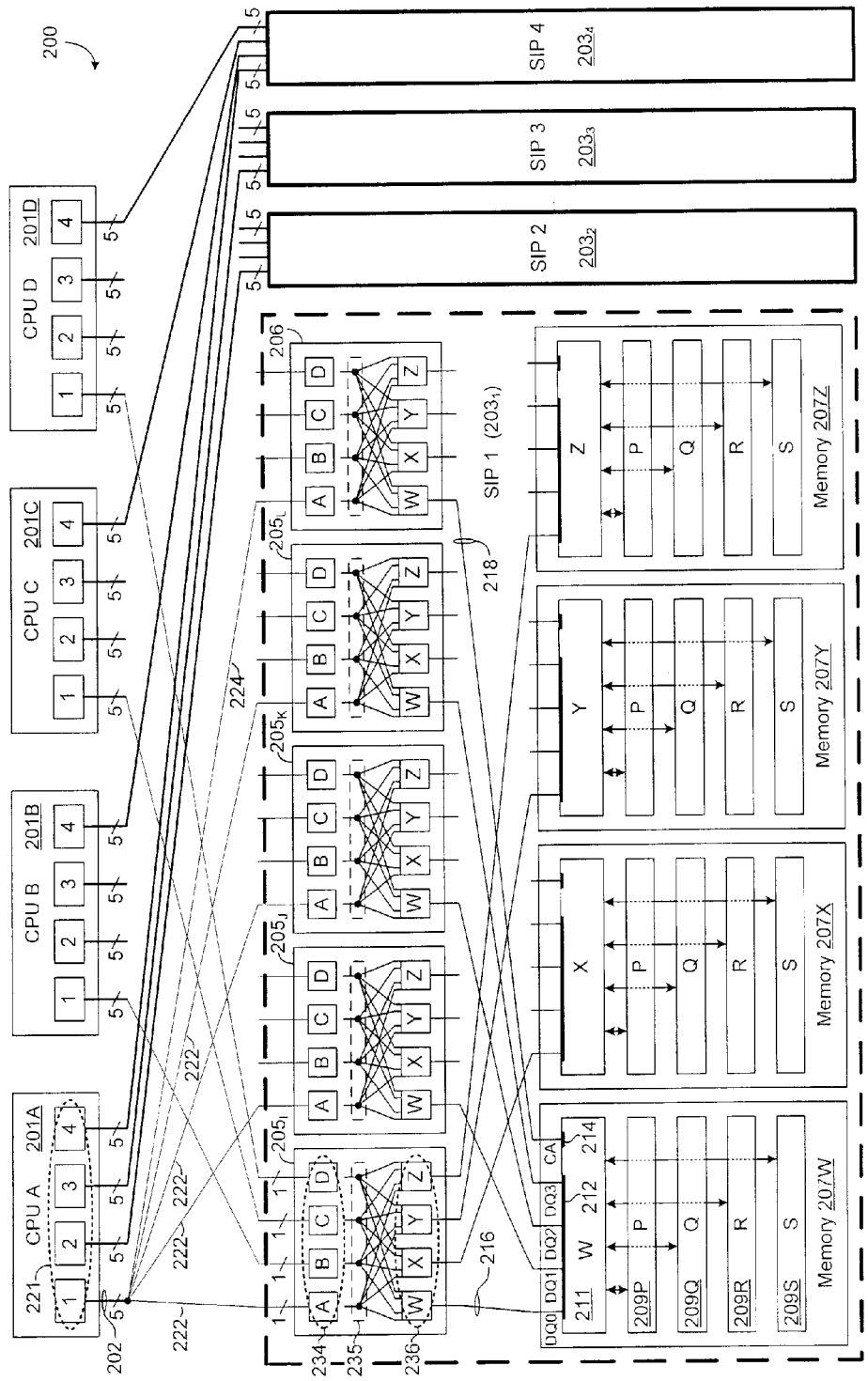
FIG. 3 illustrates a more specific embodiment of a cross-threaded memory system in which buffer devices and memory devices are disposed within multi-chip-package memory subsystems.

FIG. 3 illustrates a more specific embodiment of a cross-threaded memory system 200 in which buffer devices (205I-205L and 206) and memory devices 207W-207Z may be disposed within multi-chip-package memory subsystems $203_1$-$203_4$. In the particular embodiment of FIG. 3 and in other embodiments described below, each multi-chip package memory subsystem 203 is depicted and described as a system-in-package (SIP) arrangement (i.e., multiple die within a single integrated circuit package). In all such cases, the multi-chip package memory subsystems 203 may alternatively be, for example and without limitation, a system-on-chip (SOC), package-in-package (PIP—an arrangement in which two or more IC packages are included within a larger IC package), package-on-package (POP—an arrangement in which one or more IC packages are mounted or otherwise disposed on another IC package). Also, in the embodiment of FIG. 3 and other embodiments described below, the memory access requestors are depicted and described as central processing units (CPUs) 201A-201D, though virtually any device or system of devices capable of initiating memory access requests, either in response to programmed control or requests or commands from another device, may alternatively be used to implement one or more of the CPUs 201. Further, for purposes of example only, a specific number of CPUs 201, memory subsystems 203 and memory devices/buffer devices (207, 205, 206) per memory subsystem 203 are shown. More or fewer CPUs, memory subsystems, memory devices and/or buffer devices may be provided in alternative embodiments.

In one embodiment, shown in the FIG. 3 detail view of memory subsystem $203_1$ (i.e., SIP1), each memory subsystem 203 may include a set of four multi-bank memory devices 207 (four-bank memory devices in this example), a set of data buffer devices $205_I$-$205_L$ (data buffers) and an address buffer device 206 (address buffer). Each memory device 207 may include a control logic circuit 211 having a data interface 212 and a command/address (CA) interface 214, with the data interface 212 including four data input/output (I/O) ports (DQ0-DQ3) coupled to data buffers 205I-205L, respectively, via data paths 216, and the CA interface 214 coupled to the address buffer 206 via CA path 218. For purposes of example, the memory devices 207 may be synchronous double-data rate (DDR) DRAM devices that respond to commands and addresses received at CA interface 214, by outputting read and receiving write data via data interface 212. As discussed further below, timing information (e.g., clocking information to time receipt of incoming command/address values and to provide a timing reference within the synchronous DRAM device, and strobe signals to time inbound and outbound data transfer) as well as other control information (e.g., clock enable, chip select) and the like may also conveyed via the CA path 218 and/or the data paths 216.

In one embodiment, each of the CPUs 201A-201D may include multiple memory access queues 221 (memory queues, for short) numbered 1-4, with each of the memory queues 221 coupled to a respective one of the memory subsystems $203_1$-$203_4$ via a set of control-side data paths 222 and a control-side command/address (CA) path 224. Further, in the particular embodiment shown, each of the data paths 222 and address paths 224 may be implemented by a single-bit differential, point-to-point signaling link that may be operated at a signaling rate that is an integer multiple of the signaling rate applied across the memory-side data paths and address path. For example, in one implementation, each of the five control-side signaling links coupled to a given memory queue 221 may operate at 2 Gigabits per second (Gb/s), while the memory-side data paths 216 are operated at 0.2 Gb/s and the memory-side CA path 218 may operate at 0.1 Gb/s. These exemplary signaling rates and path widths are carried forward in further embodiments described below, but may be different in alternative embodiments.

As in the embodiment of FIG. 1, each of the five buffer devices (205I-205L and 206) within a memory subsystem 203 may include multiple control interfaces 234 coupled respectively to CPUs 201A-201D, multiple memory interfaces 236 coupled respectively to the constituent memory devices 207 of the memory subsystem, and switching circuitry 235 to enable concurrent and exclusive coupling between the control interfaces 234 and memory interfaces 236 as necessary to provide switched access to each of the memory devices by each of the CPUs. In the particular example shown, there may be four memory interfaces 236 (designated W-Z, and thus referred to herein as 236-W, 236-X, 236-Y and 236-Z) coupled respectively to the four memory devices 207W-207Z, and four control interfaces 234 (designated A-D and referred to herein as 234-A, 234-B, 234-C and 234-D) coupled respectively to the four CPUs 201A-201D. The number of memory interfaces 236 and/or control interfaces 234 may change with the number of memory devices and/or CPUs (or other memory access requestors).

Figure 4:
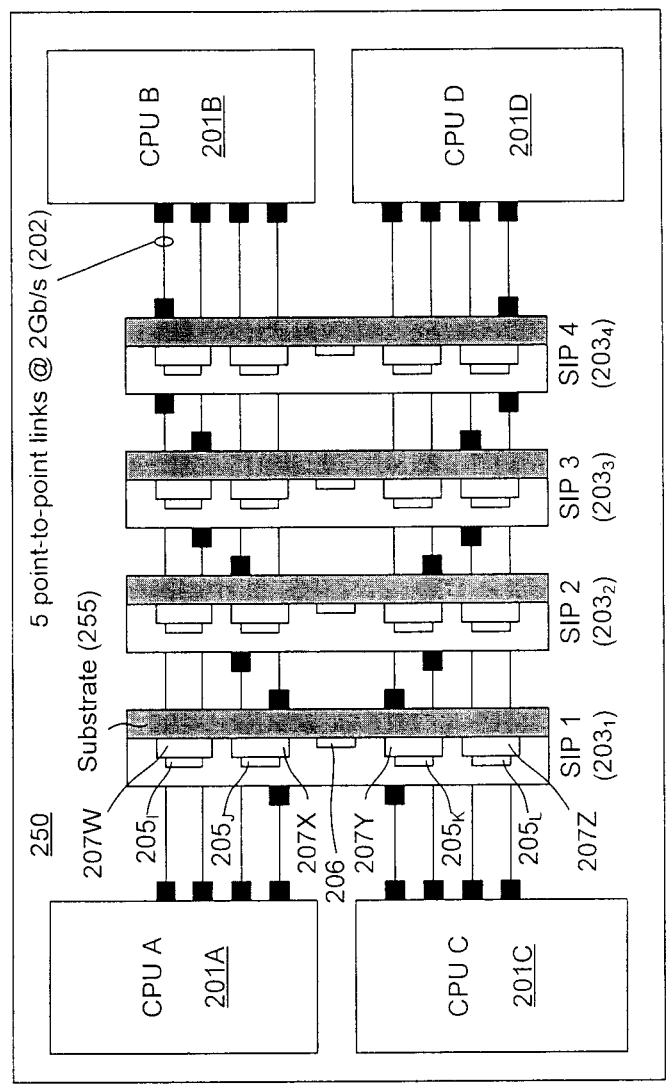
FIG. 4 illustrates an exemplary layout of the cross-threaded memory system of FIG. 3, with memory subsystems disposed in a central region of a printed circuit board between central processing units or other memory access requestors.

FIG. 4 illustrates an exemplary layout of the cross-threaded memory system 200 of FIG. 3, with memory subsystems $203_1$-$203_4$ disposed in a central region of a printed circuit board 250 between CPUs 201A-201D. In the particular embodiment shown, the memory subsystems may be SIPs (SIP1-SIP4) each having a substrate 255 with memory devices 207W-207Z mounted thereto. The data buffers, 205I-205L may be mounted on the memory devices 207W-207Z, respectively, and the address buffer 206 may be disposed centrally on the substrate 255 between the memory devices 207. Each of the CPUs 201A-201D is coupled to each of the SIP memory subsystems $203_1$-$203_4$ by a respective set of five point-to-point links 202 operated, for example, at 2 Gb/s. The memory subsystems 203 are depicted as mounted on their sides but may alternatively be disposed face-down or face-up on the printed circuit board 250. The printed circuit board 250 itself may be a daughterboard having an interconnection structure (e.g., edge connector) for insertion within a socket of a larger circuit board or backplane, or may itself be a main board within a data processing system such as a gaming console, workstation, etc. As discussed above, more or fewer CPUs 201 and/or memory subsystems 203 may be provided in alternative embodiments, and the memory subsystems 203 may have more or fewer constituent buffer devices (205, 206) and/or memory devices 207 and may be implemented by structures other than system-in-package.

Figure 5:
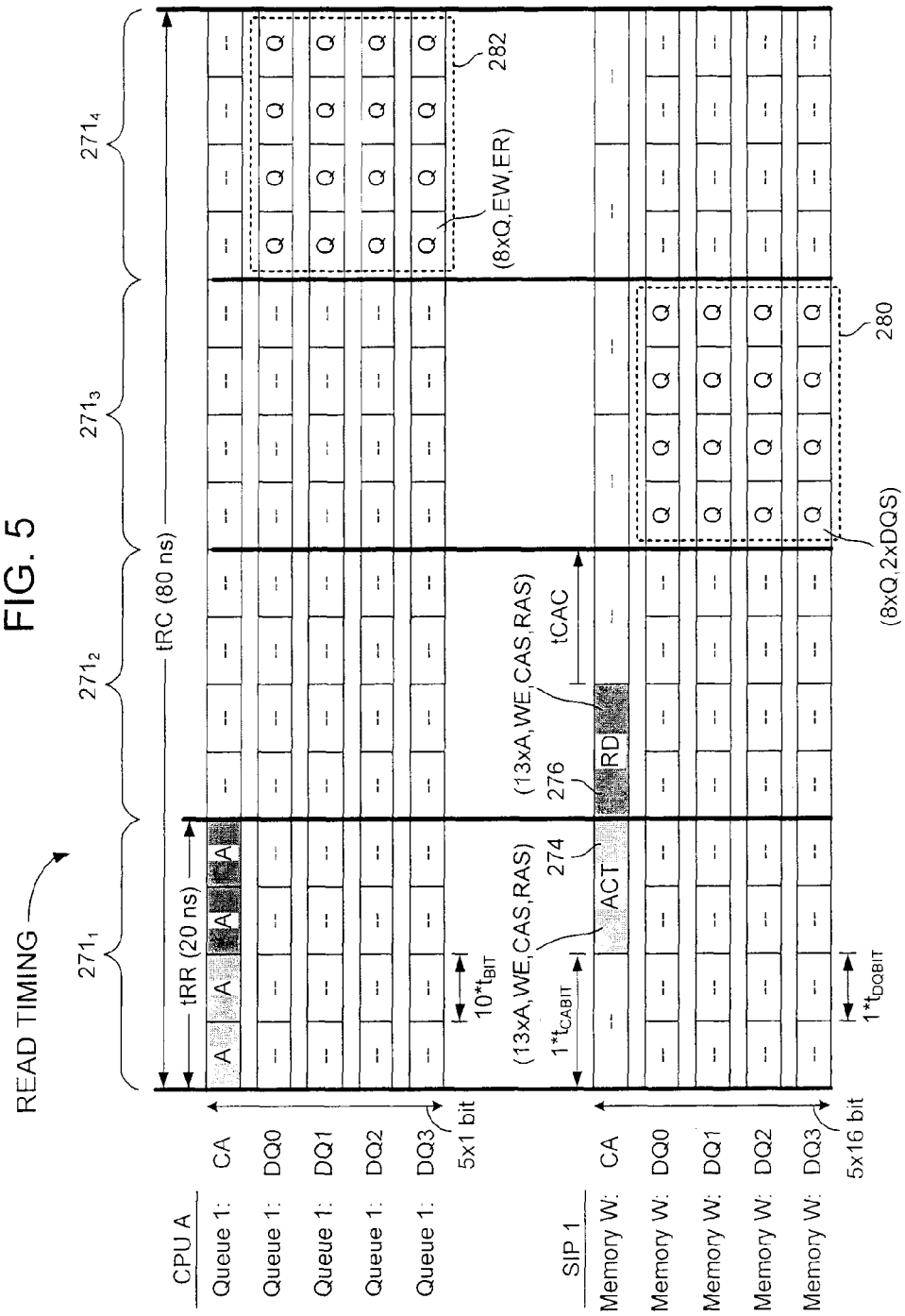
FIG. 5 is an exemplary timing diagram for a memory read operation carried out within the cross-threaded memory system of FIG. 3.

FIG. 5 is an exemplary timing diagram for a memory read operation carried out within the cross-threaded memory system 200 of FIG. 3, and showing in particular the control information and data conveyed between memory queue 221-1 ("Queue 1") of CPU A and memory device 207W ("Memory W") of memory subsystem $201_1$. In the particular embodiment shown, the tRC interval may be 80 nanoseconds (80 ns), and the tRR interval may be 20 ns. This timing arrangement may permit a total of 40 bits of information (2 bits/ns) to be transferred via each of the five single-bit 2 Gb/s links (i.e., 5×1-bit) between Queue 1 and SIP1 in each tRR interval. More specifically, at the start of a memory read transaction, an activation command may be conveyed via the control-side command/address link (designated "Queue 1: CA" in FIG. 5) in the 20-bit (i.e., 10 nS) interval that constitutes the first half of tRR interval $271_1$. As described in further detail below, the address buffer 206 may include circuitry to deserialize (i.e., convert to parallel form) the incoming serial command/address bit stream to form an activation control word 274 ("ACT") that includes the address of a row to be activated (i.e., a 13-bit row address value, "13xA," in this example), and a corresponding row-activation command encoded into signals WE, CAS and RAS. In the embodiment shown, the row-activation control word 274 may be output onto the memory-side command/address path (designated "Memory W: CA" in FIG. 5) at 0.1 Gb/s (e.g., at single-data rate with respect to a 100 MHz clock signal) and thus at a command path ($t_{CABIT}$) bit time of 10 ns that spans the second half of tRR interval $271_1$. Because only sixteen bits of information are conveyed via the memory-side CA path per 10 ns interval, versus 20-bits via the control-side CA path, additional bandwidth may be available on the control-side CA path (8 bits per tRR interval or 4 bits per command/address transfer) and may be used to convey error information and/or to support error handling protocols as discussed below.

During the second half of tRR interval $271_1$, while the activate command and corresponding address are conveyed to memory device W via the memory-side CA path, a column read command may be conveyed to the address buffer via the control-side CA path. As with the activate command/address, the address buffer may convert the serial bit stream in which the column read command is conveyed into a sixteen bit column-read control word 276 that includes three-bit column-read code (signaled by the encoding of WE, CAS and RAS signals) and a 13-bit column address. The control word 276 is output to memory device 207W (i.e., as shown in FIG. 4) during the first half of tRR interval $271_2$. The correspondence between the command/address information conveyed via the control-side CA path and the memory-side CA path is shown in FIG. 5 by the lightly shaded activation command and darker shaded column read command.

Memory device 207W may respond to the activation control word 274 by activating the address-specified row of memory cells within a selected memory bank, thus making the contents of the row available for read and write access in subsequent column operations. As discussed above in reference to FIG. 2, the bank address may be stepped through a predetermined sequence of values in successive tRR intervals 271 and thus may be generated within the address buffer (e.g., by a modulo counter), within one or more of the CPUs 201 shown in FIG. 3, or within another integrated circuit device, not shown in FIG. 3. In any case, after the row activation is completed, memory device 207W may perform a column read operation at the column address specified in association with the column-read control word 276 (and in the bank specified by the sequenced bank address) to retrieve a data word 280 that is output to the data buffers 205 starting a predetermined time, tCAC, after the column-read control word 276 has been received. More specifically, the data word 280 may be output during four successive 5 ns data-bit intervals (i.e., $t_{DQBIT}$, 0.2 Gb/s) within tRR interval $271_3$, and in respective slices via the four byte-wide data lanes, DQ0-DQ3, that constitute the 32-bit data path coupled to memory device 207W. In one embodiment, the signals output via each of the data lanes may include eight data bits ("8xQ") and may be accompanied by a differential data strobe signal ("2xDQS") that is used to time sampling of the read data within the data buffers 205. Thus, a total of 128 bits of read data are output from memory device W in response to the column read command, with four bytes being output via respective memory-side byte lanes in each of four consecutive 5 ns data-bit intervals. In the tRR interval immediately following output of read data word 280 from memory device 207 (i.e., tRR interval $271_4$), the read data may be output in more serial form (282) from the data buffers 205 to CPU 201A where it is buffered in memory queue 221-1. As shown, each of the data buffers 205I-205L may output a set of eight data bits, 8xQ, along with error bits EW and ER in each 5 nS interval of tRR interval $271_4$ and via a respective one of control-side data links DQ0-DQ3. Thus, each data buffer may output 32 bits of data and eight error bits over tRR interval $271_4$, with the data buffers collectively returning 128 bits of data and 32 bits of error information to CPU 201A in response to the activation and column read commands issued in tRR interval $271_1$. As discussed in further detail below, the error read bit, ER, included with each read data byte may be generated by an error-bit generator (e.g., a parity bit generator) within one of the data buffers 205 based on the corresponding read data byte. The error write bit, EW, may be generated based on one or more write data bytes received within the data buffer in prior write transactions.

Figure 6:
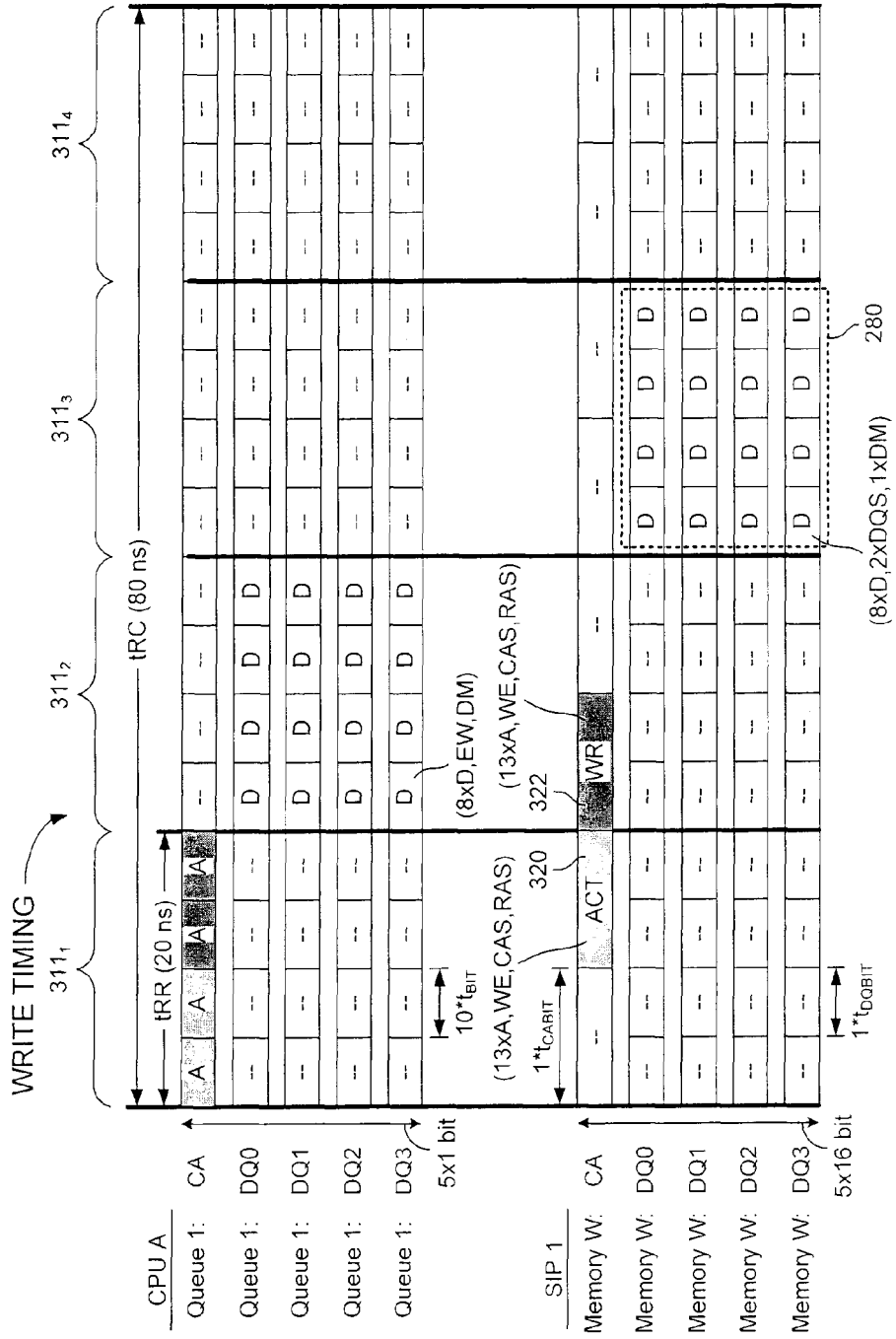
FIG. 6 is an exemplary timing diagram for a memory write operation carried out within the cross-threaded memory system of FIG. 3.

FIG. 6 is an exemplary timing diagram for a memory write operation carried out within the cross-threaded memory system 200 of FIG. 3 and, like FIG. 5, shows in particular the control information and data conveyed between memory queue 221-1 (Queue 1) of CPU 201A and memory device 207W of memory subsystem $203_1$. As in FIG. 5, the tRC interval may be 80 ns, and the tRR interval 20 ns, thus permitting a total of 40 bits of information (2 bits/ns) to be transferred via each of the 2 Gb/s links between Queue 1 and memory subsystem $203_1$ in each tRR interval. At the start of a memory write transaction, an activation command may be conveyed via the control-side CA link in the 20-bit interval that constitutes the first half of tRR interval $311_1$, and may be deserialized by the address buffer to generate a row-activation control word 320 ("ACT") that may include the address of the row to be activated (13xA), and a corresponding row-activation command in a 3-bit command code (encoded within WE, CAS and RAS signals). As in FIG. 5, the row-activation control word 320 may be output onto the memory-side CA path at 0.1 Gb/s ("ACT") at a command path bit time ($t_{CABIT}$) of 10 ns and thus spans the second half of tRR interval $311_1$. Because only sixteen bits of information are conveyed via the memory-side CA path per 10 ns interval versus 20-bits via the control-side CA path, additional bandwidth may be available on the control-side CA path and may be used convey error information and/or to support error handling protocols.

During the second half of tRR interval $311_2$, while the activation control word 320 is conveyed to memory device 207W via the memory-side CA path, a column write command is conveyed to the address buffer 206 via the control-side CA path. As with the activate command/address, the address buffer 206 converts the serialized write command into a 16-bit column write control word 322 ("WR") that includes three-bit column-write code (encoded within the WE, CAS and RAS signals) and a 13-bit column address. The correspondence between the command/address information conveyed via the control-side CA path and the memory-side CA path is shown by light grey shading for row-activation control word 320 and dark grey shading for column write control word WR 322.

Memory device 207W may respond to the row-activation control word ACT 320 by activating the address-specified row of memory cells within a selected memory bank, thus making the contents of the row available for read and write access in subsequent column operations. As discussed above, the bank address may be stepped through a predetermined sequence of values in successive tRR intervals and thus may be generated within address buffer 206 (e.g., by a modulo counter), within one or more of the CPUs 201, or within another integrated circuit device. In any case, after the row activation is completed and a predetermined time, tCAC, after the column write control word 322 has been received, write data may be transferred from the data buffers 205I-205L to memory device 207W for storage therein at the column address specified within the column write control word (and in the bank specified by the sequenced bank address), thus effecting a column write operation. As shown, the write data may be output from the data buffers 205 to memory device 207W during four successive 5 ns data-bit intervals (i.e., $t_{DQBIT}$, 0.2 Gb/s) within tRR interval $311_3$, and in respective slices via the four byte-wide data lanes, DQ0-DQ3, that constitute the 32-bit data path coupled to memory device 207W. In one embodiment, the signals transmitted to the memory device 207W may be counterparts to those transmitted by the memory device 207W during a memory read, and thus include eight data bits (8xQ) accompanied by a differential data strobe signal (2xDQS). Accordingly, a total of 128 bits of write data may be transmitted to memory device W in conjunction with the column write command, with four bytes being output via respective byte lanes DQ0-DQ3 in each of four consecutive 5 ns data-bit intervals. The memory device 207W may store the write data at the address-specified column location of the address-specified bank to conclude the memory write operation.

Figure 7:
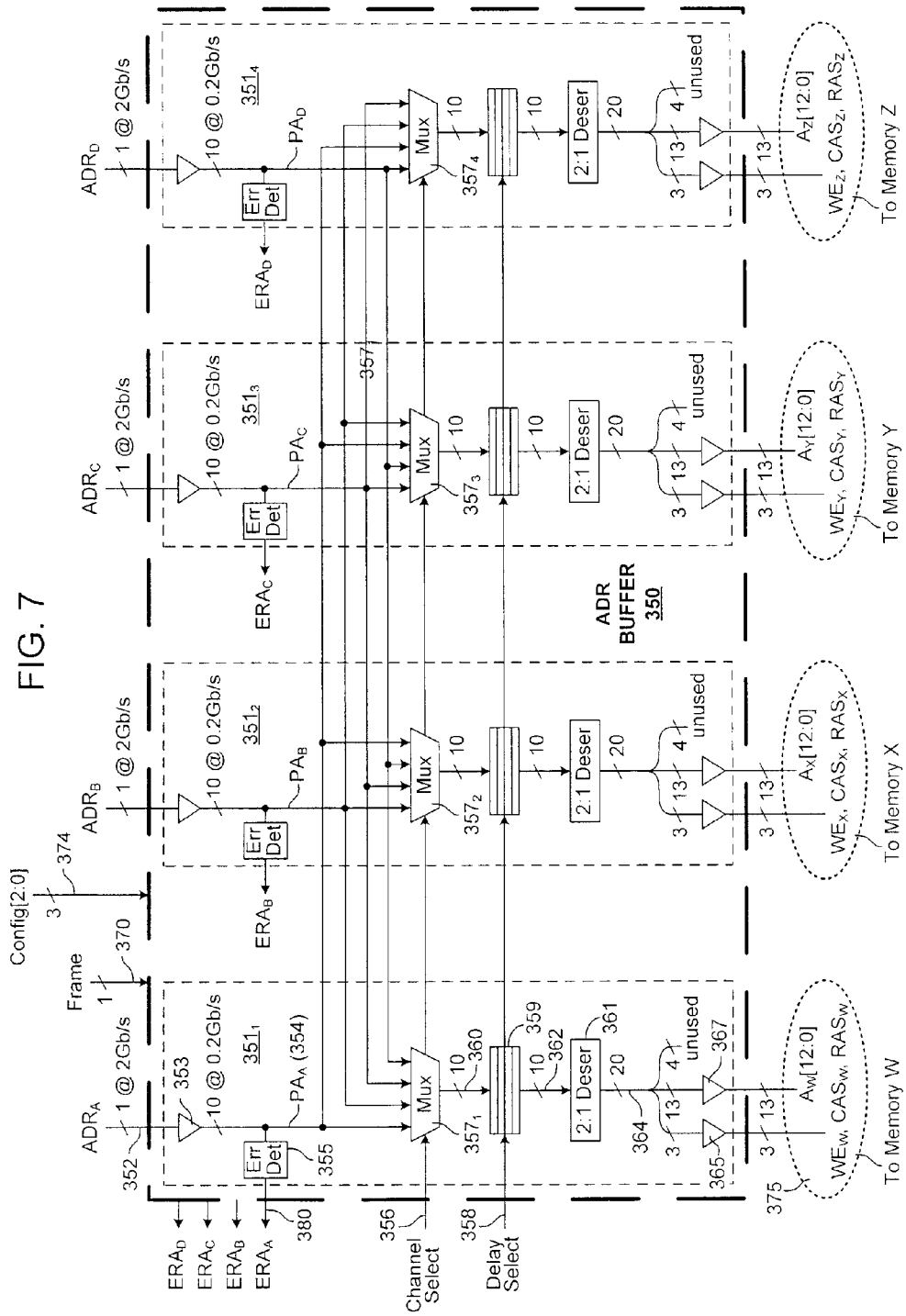
FIG. 7 illustrates an embodiment of an address buffer that may be used to implement the address buffer depicted in FIG. 3.

FIG. 7 illustrates an embodiment of an address buffer 350 that may be used to implement the address buffer 206 of FIG. 3. As shown, the address buffer 350 may include four conversion circuits $351_1$-$351_4$, each having a high-speed serial control interface 352 to receive serialized command/address signals ($ADR_A$-$ADR_D$) from a respective memory access requestor (e.g., a respective one of CPUs 201A-201D in FIG. 3), and a memory interface 375 to output command/address information in parallel to a respective memory device (e.g., a respective one of memory devices 207W-207Z in FIG. 3). Following the timing and path-width examples described in reference to FIGS. 3-5, each control interface 352 may be a single-link differential interface having a differential receiver 353 to sample an incoming signal at 2 Gb/s. Single-ended signaling interfaces may be provided in alternative embodiments. In one embodiment, a relatively low-frequency clock signal referred to herein as a framing signal 370 ("Frame") may be supplied to the address buffer 350 (and to each of the corresponding data buffers as described below) to provide a frequency reference and to frame transmission of related groups of signals. For example, in one embodiment, the framing signal 370 may be a 100 MHz clock having a rising edge at the start of each half tRR interval, and thus frames 20-bit transmissions on the 2 Gb/s control-side data and command/address paths, two-bit transmissions on the 0.2 Gb/s memory-side data paths, and single-bit transmissions on the 0.1 Gb/s memory-side command/address paths. The address buffer 350 (and corresponding data buffers) may include clocking circuitry (e.g., phase-locked-loop or delay-locked-loop circuitry and corresponding phase-adjust circuitry) to generate 2 Gb/s control-side timing signals having desired phase offsets relative to the framing signal 370 or another reference. The address buffer 350 (and corresponding data buffers) may similarly include clock synthesis circuitry to generate timing signals (e.g., clock signal, CK, and write data strobe DQS) that are output to the memory devices to time reception of command/address and write data signals, and to enable the memory devices to generate read data timing signals (e.g., read data strobe, DQS).

Referring to address conversion circuit $351_1$, which is representative of the operation of counterpart address conversion circuits $351_2$-$351_4$, the incoming 2 Gb/s command/address signal, $ADR_A$, is sampled and deserialized (i.e., converted to parallel form) by receiver 353 to generate a 10-bit parallel command/address value 354 ($PA_A$) every 5 ns (i.e., at 0.2 Gb/s). In one embodiment, each command/address value 354 includes eight bits of command/address information and an error-check bit (e.g., a parity bit), and is supplied to an error detection circuit 355 and also to an input port of a four-port multiplexer $357_1$ (or other selector circuit). The error detection circuit 355 generates an error-check bit based on the corresponding command/address byte and compares the generated error-check bit with the received error-check bit to generate an error indication 380 ($ERA_A$) having a high or low state (signaling error or no error) according to whether the error-check bits match. Counterpart address conversion circuits $351_2$-$352_4$ simultaneously generate error indications, $ERA_B$, $ERA_C$ and $ERA_D$, so that four error indications 380 are generated during each 5 ns command/address reception interval.

Channel multiplexer $357_1$ outputs either command/address value $PA_A$ (354) or one of the three command/address values $PA_B$-$PA_D$ from counterpart conversion circuits 351, as a selected command/address value 360, depending on the state of a channel select signal 356. Each of the channel multiplexers $357_2$-$357_4$ within the counterpart conversion circuits $351_2$-$351_4$ are coupled to receive the $PA_A$-$PA_D$ values at respective input ports in an interconnection order that yields the following selection of command/address values (360) for the four possible values of a two-bit channel select signal 356:

TABLE 1

| Channel Select | Channel Mux $357_1$ | Channel Mux $357_2$ | Channel Mux $357_3$ | Channel Mux $357_4$ |
|---|---|---|---|---|
| 00 | $PA_A$ | $PA_B$ | $PA_C$ | $PA_D$ |
| 01 | $PA_B$ | $PA_C$ | $PA_D$ | $PA_A$ |
| 10 | $PA_C$ | $PA_D$ | $PA_A$ | $PA_B$ |
| 11 | $PA_D$ | $PA_A$ | $PA_B$ | $PA_C$ |

Still referring to representative conversion circuit $351_1$, the selected command/address value 360 is supplied to a delay circuit 359 which introduces a selectable delay in accordance with a delay select value 358. For example, in one embodiment, the delay circuit 359 is implemented by shift register in which the selected command/address value 360 is shifted forward from tail to head in response to a shift-enable signal (e.g., in response to the 2 Gb/s sampling clock signal or a phase-shifted and/or frequency-divided version thereof), with the total number of storage stages from tail-to-head being selected to achieve a desired delay between receipt of an incoming serialized command/address value at control interface 352, and output of a final command code and address value at memory interface 375. After passing through the delay circuit 359 (which may alternatively be disposed in advance of the channel multiplexer $357_1$), the resulting delayed command/address value 362 is supplied to a 2:1 deserializing circuit 361 which converts each successive pair of delayed, 10-bit command/address values 362 (each value 362 received at 0.2 Gb/s) to a final 20-bit command/address value 364, with the resulting sequence of final command/address values 364 being output at 0.1 Gb/s. As shown, within each 20-bit command/address value, four bits are unused, and the remaining 16 bits are output via memory interface 375. More specifically, command transmitter 365 outputs a 3-bit command encoded into signals $WE_W$, $RAS_W$ and $CAS_W$ (the 'W' subscript denoting that the command is directed to Memory W), and address transmitter 367 outputs a corresponding 13-bit address value, $A_W[12:0]$. Counterpart conversion circuits $351_2$-$351_4$ concurrently output 3-bit command codes and 13-bit address values directed to memory devices X, Y and Z.

Still referring to FIG. 7, a set of configuration signals 374 (Config[2:0]) may be provided to the address buffer 350 to control various functions (e.g., establishing termination impedance, signaling calibration, etc.) and operating modes therein. For example, in one embodiment, the address buffer 350 includes circuitry to support operation as either an address buffer as described above and in reference to address buffer 206 of FIG. 3, or a data buffer as described below and in reference to data buffer 205 of FIG. 3. In this way, a given buffer device may be programmed to operate as either an address buffer or a data buffer, thus avoiding the need to fabricate separate integrated circuit devices. Other configurable aspects of the device may include error detection policies, delay ranges, signal fan-out, signals driven on otherwise unused portions of the 20-bit output bandwidth, and so forth. The configuration signals may also be used to select timing calibration modes during which phase offsets between reference and internal clock signals (or strobe signals or other timing signals) are established.

Figure 8:
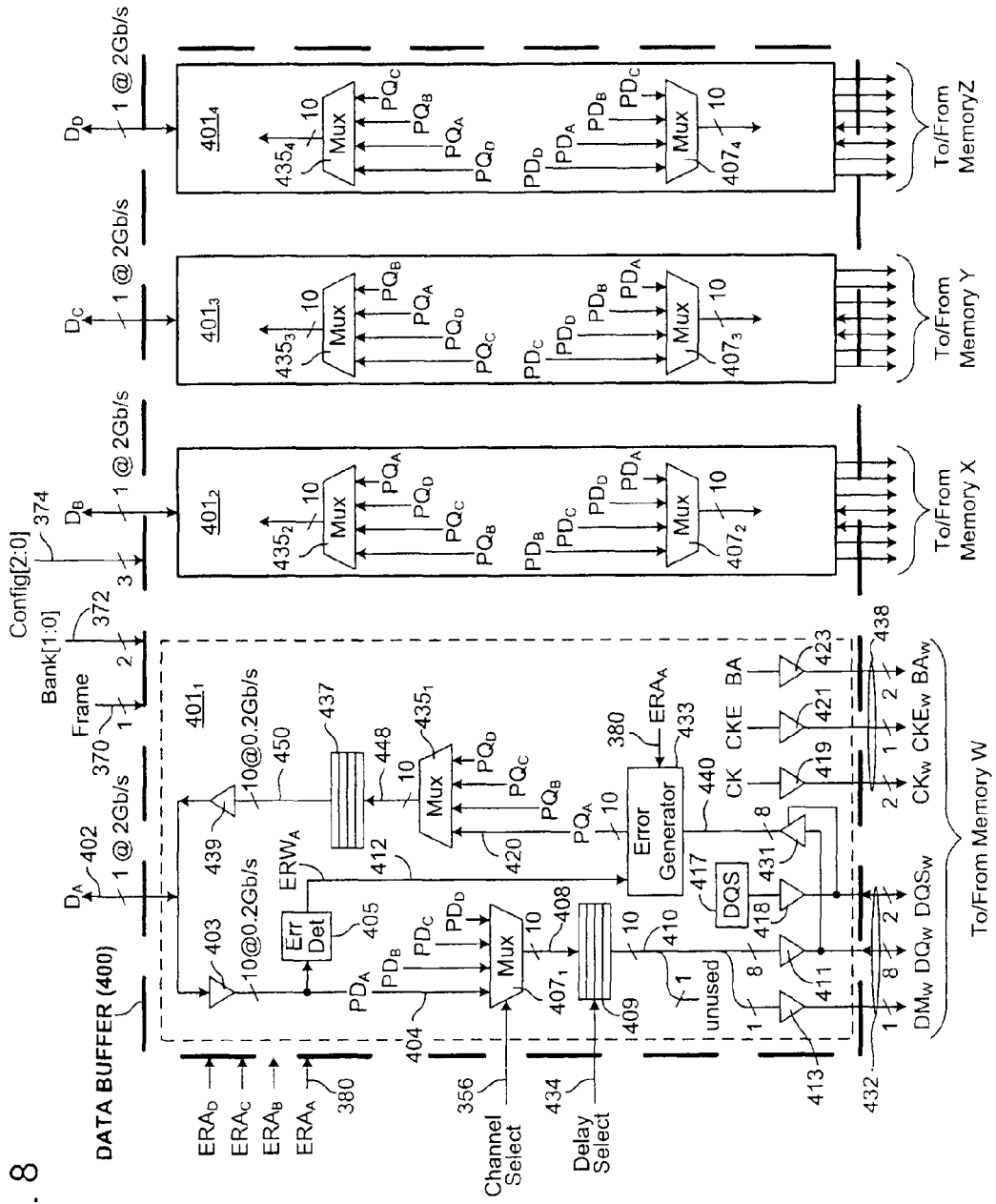
FIG. 8 illustrates an embodiment of a data buffer that may be used to implement the data buffers depicted in FIG. 3.

FIG. 8 illustrates an embodiment of a data buffer 400 that may be used to implement data buffers 205I-205L of FIG. 3. Data buffer 400 includes four conversion circuits $401_1$-$401_4$, each having a high-speed serial interface 402 to support serialized read and write data transfer to/from a respective memory access requestor (e.g., a respective one of four CPUs 201A-201D in FIG. 3), and a lower-speed parallel-I/O memory interface 432 to support parallel read and write data transfer to/from a respective one of memory devices W-Z (e.g., memory devices 207W-207Z in FIG. 3). Following the timing and path-width examples described in reference to FIGS. 3-5, each high-speed serial interface 402 may include a single-link, differential signal receiver to sample an incoming serial data signal at 2 Gb/s. The framing signal 370 provides a frequency reference and frames transmission of related groups of signals as described in reference to FIG. 7. In the embodiment of FIG. 8, and corresponding timing diagrams described below, the framing signal 370 may be a 100 MHz clock signal having a rising edge at the start of each half tRR interval, and thus frames 20-bit transmissions over the control-side signal link coupled to interface 402, and two-bit transmissions on each memory-side data line coupled to interface 432. As with the address buffer of FIG. 7, the data buffer 400 may include clocking circuitry (e.g., locked-loop circuitry and corresponding timing adjustment circuitry) to generate 2 Gb/s control-side timing signals having desired phase offsets relative to the framing signal 370, as well as clock synthesis circuitry to generate timing signals (e.g., strobe signals and clock signals having a desired phase relationship to the framing signal 370) that are output to the memory devices W-Z to time reception of address and write data (e.g., clock signal, CK, and write data strobe DQS) therein, and to enable the memory devices to generate read data timing signals (e.g., read data strobe, DQS).

Referring to conversion circuit $401_1$, which is representative of the operation of counterpart conversion circuits $401_2$-$401_4$, write data delivered in the incoming 2 Gb/s data signal, $D_A$, may be sampled and deserialized by receiver 403 to generate a 10-bit parallel data value 404 every 5 ns (i.e., at 0.2

Gb/s), $PD_A$. In one embodiment, each data value 404 may include a write data byte (i.e., 8 bits of write data), a data mask bit that indicates whether the write data value is to be written within the selected memory device, and an error-check bit generated by the memory access requestor based on the write data byte and mask bit. Data value 404 may be supplied to an error detection circuit 405 and also to an input port of channel multiplexer $407_1$ (or other selector circuit). The error detection circuit 405 re-generates an error-check bit based on the write data byte and data mask bit, and compares the re-generated error-check bit with the received error-check bit to generate a write-data error indication 412 ($ERW_A$) having a high or low state (signaling error or no error) according to whether the error-check bits match. The write-data error indication 412 may be supplied to an error generator circuit 433 along with the address-error indicator 380, $ERA_A$, generated by counterpart address conversion circuit $351_1$ of FIG. 7. The other conversion circuits $401_2$-$401_4$ may generate write-data error indications 412, $ERW_B$, $ERW_C$ and $ERW_D$ simultaneously with conversion circuit $401_1$ (i.e., so that four error indications are generated within the data buffer 400 during each 5 ns interval), and may include counterpart error generator circuits 433 to process corresponding write-data error indications 412 (i.e., $ERW_B$-$ERW_D$) as well as the address-error indications 380 (i.e., $ERA_B$-$ERA_D$) from a respective one of address/conversion circuits $351_2$-$351_4$. As discussed below, error generator circuit 433 generates a read-data error indication ($ERR_A$) based on read data received from the memory-side data interface and packs the read error information, write-data error indication and address-error indication into a parallel read-data value 420 ($PQ_A$) to be returned to the memory access requestor as part of a data read operation.

The channel multiplexer $407_1$ outputs either write data value $PD_A$ (404) or one of the three write data values $PD_B$-$PD_D$ from counterpart data conversion circuits $401_2$-$401_4$, as a selected write data value 408, depending on the state of channel select signal 356. Each of the channel multiplexers $407_2$-$407_4$ within the counterpart conversion circuits $401_2$-$401_4$ may be coupled to receive the $PD_A$-$PD_D$ values (404) at respective input ports in an interconnection order that yields the following selection of write data values (408) for the four possible values of a two-bit channel select signal 356:

TABLE 2

| Channel Select | Channel Mux $407_1$ | Channel Mux $407_2$ | Channel Mux $407_3$ | Channel Mux $407_4$ |
|---|---|---|---|---|
| 00 | $PD_A$ | $PD_B$ | $PD_C$ | $PD_D$ |
| 01 | $PD_B$ | $PD_C$ | $PD_D$ | $PD_A$ |
| 10 | $PD_C$ | $PD_D$ | $PD_A$ | $PD_B$ |
| 11 | $PD_D$ | $PD_A$ | $PD_B$ | $PD_C$ |

As with the selected command/address value 360 of FIG. 7, the selected write data value 408 may be supplied to a delay circuit 409 which introduces a selectable delay in accordance with a delay select value 434 (which may be the same as or different from delay select value 358 of FIG. 7). After passing through the delay circuit 409 (which may alternatively be disposed in advance of the multiplexer $407_1$), the resulting delayed write data value 410 may be output at 0.2 Gb/s via memory interface 432. More specifically, the write-data byte ($DQ_W$) is output by data transmitter 411 and write data mask bit ($DM_W$) is output by mask transmitter 413, with one of the ten bits of the write data value 410 being unused. In one embodiment, a strobe generator 417 is provided to generate a data strobe signal (DQS) that is output by DQS transmitter 418 in a desired phase relationship with the write data and mask bit (note that the data strobe signal may be differential or single-ended, depending upon the application). For example, in one implementation, the data strobe signal may be aligned with mid-points of data eyes to establish a desired, quadrature sampling point, and transitions for each successive write-data/mask output, thereby cycling at a maximum frequency of 100 MHz (toggling at 200 MHz).

In the embodiment of FIG. 8, conversion circuit $401_1$ may include a clock transmitter 419 and clock-enable transmitter 421 to output, respectively, a differential clock signal ($CK_W$) and corresponding clock-enable signal ($CKE_W$), thereby providing a master clock signal to the memory device that may be used to synchronize internal operations and time reception of selected signals therein (e.g., command and address signals). In one embodiment, the frame signal 370 may be output as the clock signal (e.g., at 100 MHz), though a phase-adjust circuit may be provided to establish a desired phasing between the clock signal, CK, and write data signals. Circuitry may also be provided to deassert the clock-enable signal, CKE, if no transactions are directed to the corresponding memory device, thus disabling clocking of the memory device and saving power. A bank address transmitter 423 may be provided to transmit bank address signals, $BA_W$, to memory device based on the incoming bank address signal BA[1:0] 372. As discussed, the bank address 372 may be sequenced through a predetermined pattern by a memory access requestor (e.g. one of the CPUs 201 of FIG. 3) or other device to enable round-robin or other sequential access to each of the storage banks within the corresponding memory device.

Referring to FIG. 8 and FIG. 3, it should be noted that the same set of clock, clock-enable and bank address signals (collectively 438) may be provided to each of the memory devices within a given memory subsystem, and therefore that the signal transmitters 419, 421 and 423 within conversion circuit $401_1$ may be used to supply the clock, clock-enable and bank-address signals to each memory device. In such an arrangement, the clock, clock-enable and bank-address transmitters within the other conversion circuits $401_2$-$401_4$ and within other data buffers 400 may be left unconnected or may be omitted altogether. Alternatively, each conversion circuit 401 may include transmitters 419, 421 and 423 to drive the clock, clock-enable and bank address signals to a respective one of the memory devices (W-Z) within a memory subsystem, in which case the corresponding signal transmitters may still be left unconnected (or omitted altogether) and the signal transmitters within the other three data buffers 400 used to drive clock, clock-enable and bank address signals to the remaining three memory devices. In yet another alternative embodiment, a subset of the conversion circuits 401 within a given data buffer 400 may drive clock, clock-enable and bank-address signals to respective subsets of the memory devices (e.g., two of the conversion circuits 401 may each drive clock, clock-enable and bank address signals to a respective pair of memory devices).

During a memory read operation, read data is received within conversion circuits $401_1$-$401_4$ via respective byte-wide data paths (i.e., $DQ_W$, as shown, and $DQ_X$-$DQ_Z$, not specifically labeled) and sampled in receiver circuits 431 (i.e., one byte-wide receiver 431 per conversion circuit 401) in response to a data strobe signal (DQS) output from the memory device via the differential DQS signal link. The resulting read data byte 440 is forwarded to error generator circuit 433, which generates an error-check bit (e.g., a parity bit based on the read data byte 440) to be returned to the memory access requestor along with information that indicates, based on error indications 380 and 412, whether an error has occurred within a previously received write data byte or command/address value. An error-identifier encoding scheme may be used to indicate the specific write data byte and/or command/address value (i.e., within a sequence of prior write data bytes or command/address values) in which the error was detected. Embodiments of such error-identifier encoding scheme are described, for example and without limitation, in U.S. patent application Ser. No. 11/330,524, filed Jan. 11, 2006 and entitled Unidirectional Error Code Transfer for a Bidirectional Link." U.S. application Ser. No. 11/330,524 is hereby incorporated by reference.

Continuing with the read data path within the embodiment of FIG. 8, the error generator 433 outputs a 10-bit read-data value 420 ($PQ_A$), which may be supplied to an input port of channel multiplexer 435. In one embodiment, the read-data value 420 may include the read data byte received from the corresponding memory device, the error-check bit generated based on the read data byte, and an error-indication bit that forms part of a sequence of error-indication bits within the above-mentioned error-identification scheme (i.e., identifying write-data errors and/or command/address errors). Read values $PQ_B$-$PQ_D$ from the other conversion circuits $401_2$-$401_4$ may be received at the remaining input ports of the channel multiplexer 435 to enable read data to be returned from any of memory devices W-Z to the memory access requestor coupled to data conversion circuit $401_1$. Each of the channel multiplexers 435 within the counterpart conversion circuits $401_2$-$401_4$ may be coupled to receive the $PQ_A$-$PQ_D$ values (420) at respective input ports in an interconnection order that yields the following selection of read data values (448) for the four possible values of a two-bit channel select signal 356 (note that a separate channel select signal may be provided to control the read data path):

TABLE 3

| Channel Select | Channel Mux $435_1$ | Channel Mux $435_2$ | Channel Mux $435_3$ | Channel Mux $435_4$ |
|---|---|---|---|---|
| 00 | $PQ_A$ | $PQ_B$ | $PQ_C$ | $PQ_D$ |
| 01 | $PQ_B$ | $PQ_C$ | $PQ_D$ | $PQ_A$ |
| 10 | $PQ_C$ | $PQ_D$ | $PQ_A$ | $PQ_B$ |
| 11 | $PQ_D$ | $PQ_A$ | $PQ_B$ | $PQ_C$ |

Channel multiplexer 435 outputs the selected read-data value 448 to delay circuit 437 in accordance with the channel select signal 356, and the delay circuit 437 delays the selected read-data value 448 by some time interval as generally described in reference to FIG. 7 (e.g., the time interval indicated by the delay select value 434 or a different delay select value). By this operation, a sequence of delayed-read data values 450 are output from the delay circuit 437 at 0.2 Gb/s and provided to a serializing output driver 439 which outputs the read data and error information included therewith via high-speed serial interface 402 at 2 Gb/s.

Figure 9:
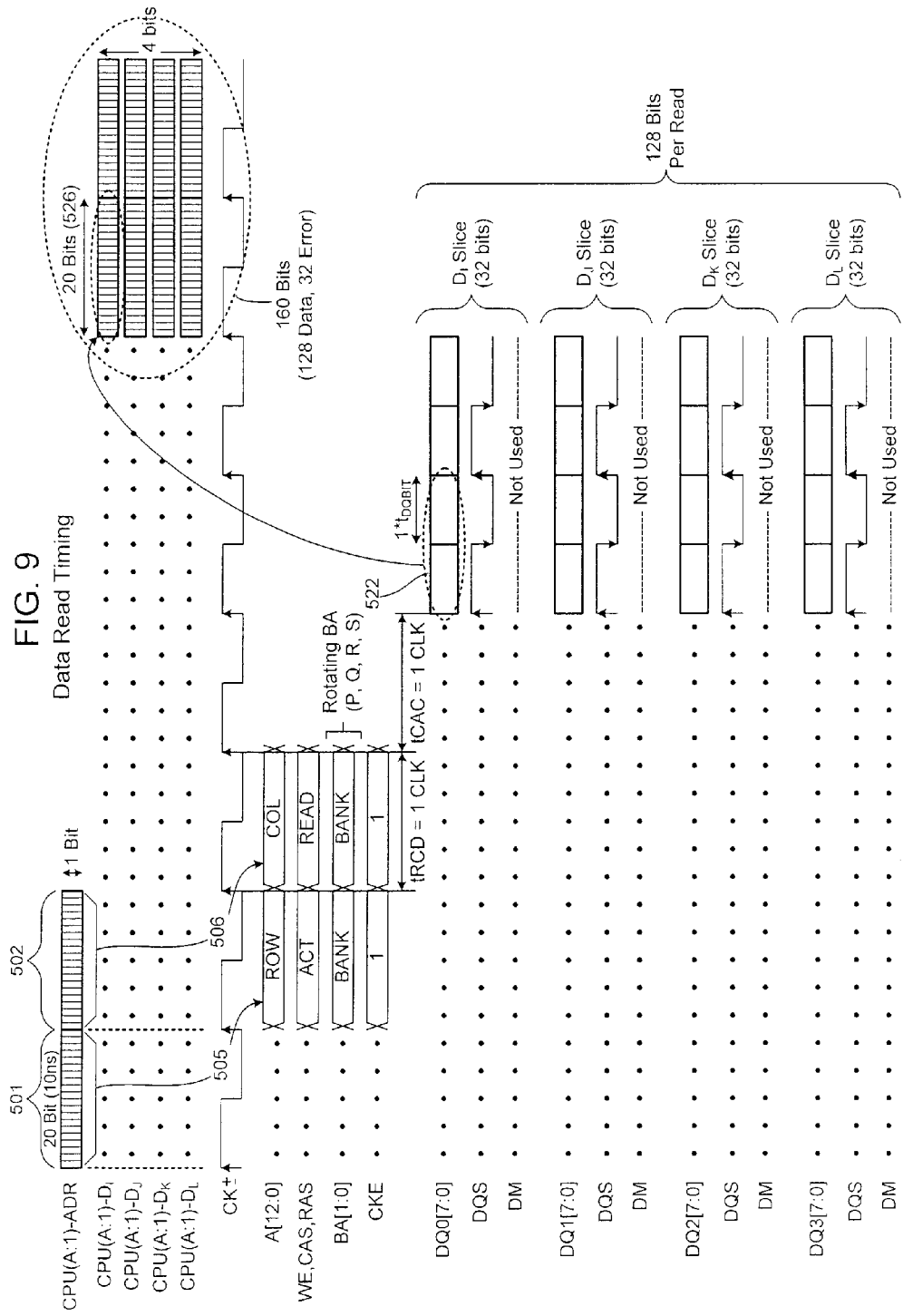
FIG. 9 illustrates an exemplary timing arrangement for a memory read operation within a cross-threaded memory system that includes the address buffer shown in FIG. 7 and data buffers as shown in FIG. 8.

FIG. 9 illustrates an exemplary timing arrangement for a memory read operation within a cross-threaded memory system that includes the address buffer 350 shown in FIG. 7 and data buffers 400 as shown in FIG. 8. Initially, a pair of 20-bit serial command/address values 501 and 502 are output via the serial, high-speed command/address link between a first control queue of CPU A and a corresponding conversion circuit 351 within address buffer 350 (designated "CPUA:1-ADR"). Address buffer 350 converts each of the serial command/address values 501, 502 into a respective parallel 13-bit address value and corresponding 3-bit command value and outputs the parallel address and command values via memory-side address lines A[12:0] and command lines (WE, CAS, RAS), respectively. More specifically, the serial command/address value 501, is output, in parallel form, as an activation command (ACT) and corresponding row address (ROW) as shown at 505, and serial command/address value 502 is output as a column-read command (READ) and corresponding column address (COL) as shown at 506. As described in reference to FIG. 8, a clock signal "CK±" (e.g., the frame signal or a clock signal derived from the frame signal), is output from at least one of the data buffers 400 along with a clock-enable signal (CKE), and rotating bank address (BA). As discussed, the bank address may be sequenced (e.g., rotated) between bank selection values, P, Q, R, S, in successive tRR intervals. As shown, the clock signal is transmitted in rising-edge alignment with the activation and column-read commands so that the falling edge of the clock signal (or phase adjusted version thereof) may be used to trigger sampling of the command and address signals at the memory device. In other embodiments the phase relationship of CK and the command and address signals may be shifted from that shown. In the timing arrangement of FIG. 9, the time delay (tRCD) between receipt of the activation command 505 and the column-read command 506 is one clock cycle, and the time delay (tCAC) between receipt of the column-read command 506 and the output of read data on the memory-side data path, is also one clock cycle. Different timing delays may apply in different embodiments.

Still referring to FIG. 9, read data is output via the 32-bit data interface of the selected memory device, with each of four data bytes being output to a respective data buffer 400 via a byte-wide data lane (DQ0[7:0]-DQ3[7:0]). By this operation, four slices of read data are routed back to the memory access requestor via four data buffers 400, respectively (e.g., via data buffers $D_I$-$D_L$ as described in reference to FIG. 3). As shown, the bit time on each data line ($t_{DQBIT}$) is 5 ns in this example, thus effecting a double data rate transfer as a different set of data bits are transmitted during each half-cycle of the clock signal, CK. Other data rates may be applied in alternative embodiments or different operating modes.

In one embodiment, the overall data transfer takes place over a 20 nS tRR interval, and thus includes four successive byte-wide data transfers (i.e., burst length=4 bytes) per data lane for a total of 128 bits of data (16 data bytes) per column read. A data strobe signal DQS may be output along with each byte and may be edge-aligned with the read data as shown (with the data receiver within the data buffer having timing delay circuitry to establish a quadrature sampling offset relative to the edge-aligned strobe) or may be quadrature aligned with the read data. The data mask signal line, which may be viewed as completing the data lane for each of lanes DQ0-DQ3, may remain unused during memory read operations.

In the tRR interval that follows transmission of the read data from the memory device to data buffers 400, the data buffers may output the read data to the appropriate control queue within the memory access requestor along with the above-described error information. More specifically, each of the data buffers 400 (e.g., buffers $D_I$-$D_L$ as shown in FIG. 3), may output two 20-bit serial read data bursts 526 in succession via a respective one of the control-side data links (designated CPU(A:0)-$D_I$ through CPU(A:1)-$D_L$ in FIG. 9) to effect a 40-bit transmission per data buffer and 160 bits in the aggregate. As shown, each 20-bit serial read data burst 526 includes the two bytes 522 output from the memory device during the corresponding portion of the prior tRR interval, as well as an error-check bit (ER) per read data byte, and an error bit (EW) that may be used as part of an error signaling protocol to identify errors detected in preceding write-data or command/address transfers. Accordingly, the 160 bits transferred via the high-speed serial links include the 128 bits of read data output from the memory device, and 32 bits of error information.

Figure 10:
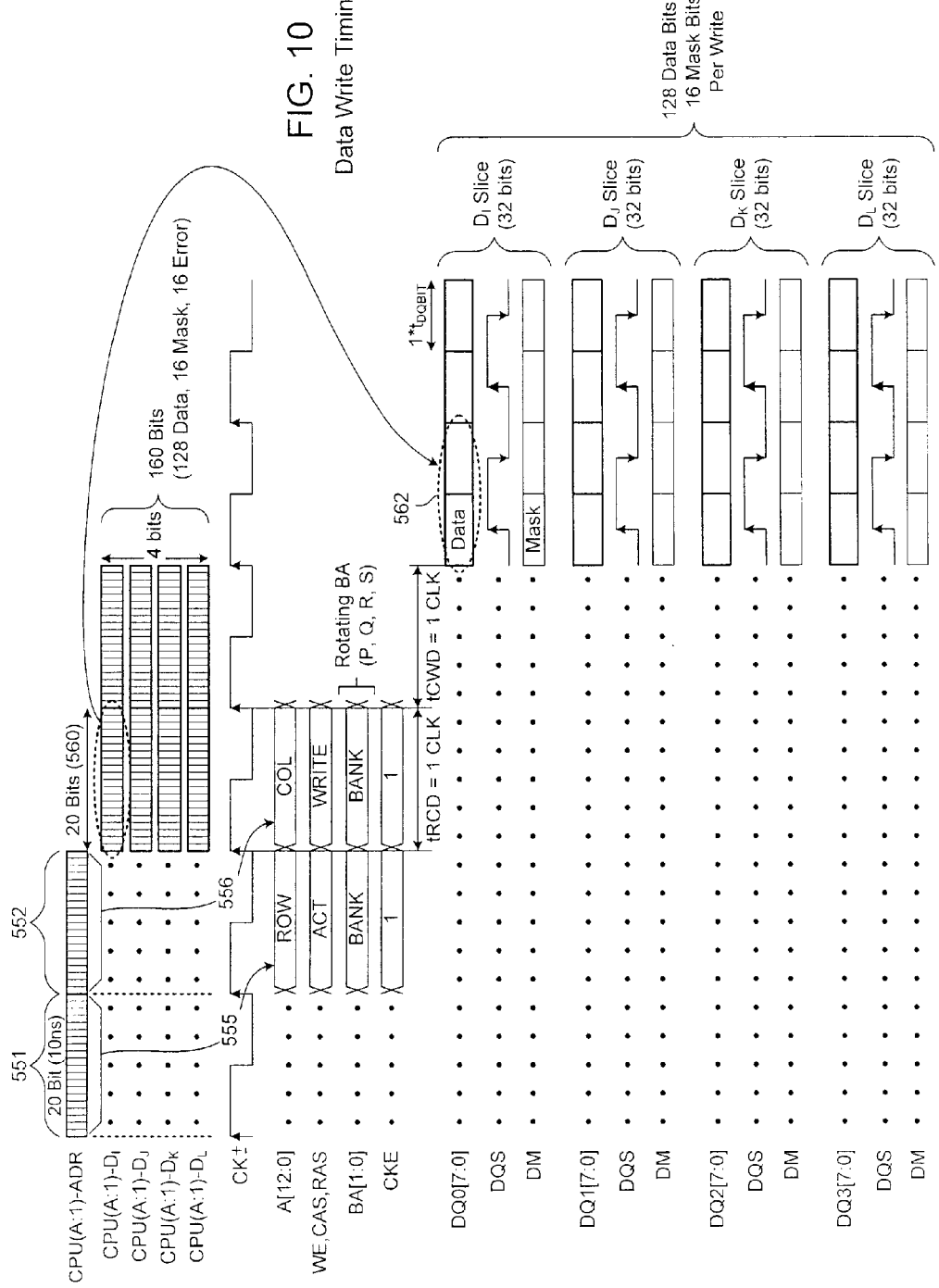
FIG. 10 illustrates an exemplary timing arrangement for a memory write operation within a cross-threaded memory system that includes the address buffer shown in FIG. 7 and data buffers as shown in FIG. 8.

FIG. 10 illustrates an exemplary timing arrangement for a memory write operation within a cross-threaded memory system that includes the address buffer 350 shown in FIG. 7 and data buffers 400 as shown in FIG. 8. The memory write operation may be initiated by a pair of 20-bit serial command/address values 551 and 552 transmitted via the high-speed serial command/address link CPUA:1-ADR. Address buffer 350 may convert each of the serial command/address values 551, 552 into a respective parallel 13-bit address value and corresponding 3-bit command value and outputs the parallel address and command values via memory-side address lines A[12:0] and command lines (WE, CAS, RAS), respectively. More specifically, the serial command/address value 551 may be output, in parallel form, as an activation command (ACT) and corresponding row address (ROW) as shown at 555, and serial command/address value transmitted in the following tRR interval 552 is output as a column write command (WRITE) and corresponding column address (COL) as shown at 556. As discussed in reference to FIGS. 8 and 9, a clock signal (CK±) may be output from at least one of the data buffers 400 along with a clock-enable signal (CKE), and rotating bank address (BA). As in the timing arrangement of FIG. 9, the time delay (tRCD) between receipt of the activation command 555 (ACT) and the column write command 556 (WRITE) is one clock cycle.

In the tRR interval immediately following transmission of the serial command/address values 551 and 552 to the address buffer, write data may be output from the CPUA control queue, to each of four data buffers via respective high-speed serial data links CPU(A:1)-$D_T$-CPU(A:1)-$D_L$. In one embodiment, the write data output via each link may include two 20-bit data bursts (560) per tRR interval, with each 20-bit data burst 560 including two write data bytes, two data mask bits and two error-check bits; one data mask bit and one error-check bit per data byte. By this operation, four write data bytes, four data mask bits and four error-check bits may be transmitted to each of the four data buffers per tRR interval, thus effecting a total transfer of 128 write data bits (16 bytes), 16 data mask bits and 16 error-check bits, for a total of 160 bits per column write operation.

Following the example in FIG. 9, the time delay between receipt of the activation command and the column write command, tRCD, may be one clock cycle, and the time delay between receipt of the column-read command and write data output on the memory-side data path, tCWD, may also be clock cycle (different timing delays may apply in different embodiments). Accordingly, during the tRR interval that follows write data transmission from the memory access requestor to the data buffers, each of the data buffers may output a sequence of four write data bytes to the selected memory device via a respective one of data lanes DQ0-DQ3, with each 20 bit write data value 560 being output in a successive pair of byte-wide data transfers 562. A data strobe signal, DQS, may be output in either quadrature or edge alignment with the write data (quadrature alignment is shown in FIG. 10) via the data strobe line, and a data mask value is output via the data mask line. Thus, a total of four bytes (32 bits) and four corresponding data mask bits may be provided to the selected memory device via respective data lanes, with a total of 16 bytes (128 bits) and 16 data mask bits being provided per column write operation.

Figure 11:
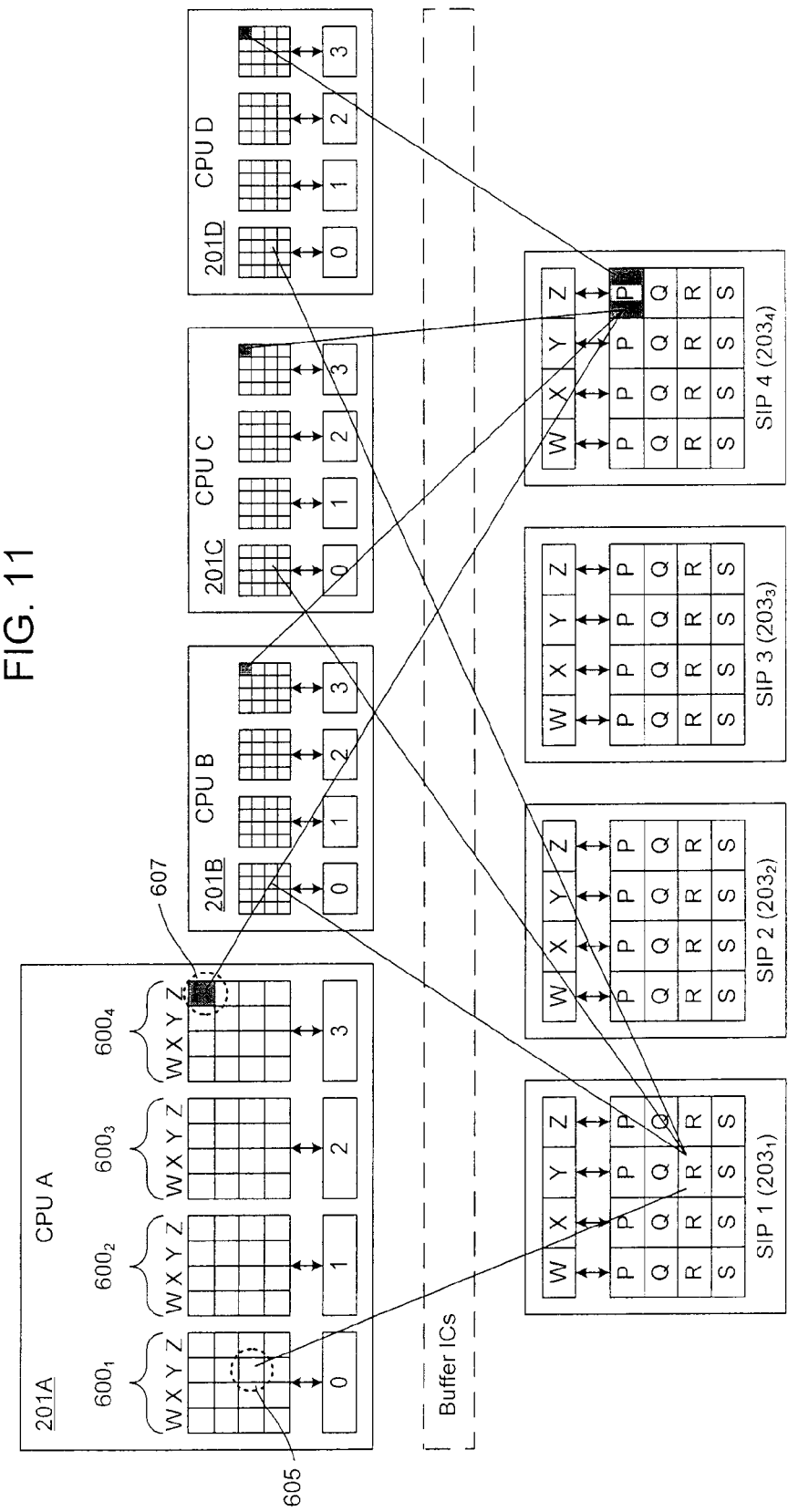
FIG. 11 illustrates an exemplary arrangement of memory access queues within the central processing units of FIG. 3 and their relation to memory banks within memory devices of the memory subsystems.

FIG. 11 illustrates an exemplary arrangement of memory access queues within the CPUs 201A-201D of FIG. 3 and their relation to memory banks P-S within memory devices 207W-207Z of memory subsystems $203_1$-$203_4$. As shown, each of the CPUs 201 may include four queue arrays $600_1$-$600_4$, one for each of the memory subsystems 203, with each queue array 600 including four columns of control queues that correspond to the memory devices 207W-207Z within the corresponding memory subsystem 203, and four rows of control queues that correspond to banks P, Q, R and S within the individual memory devices 207. Thus, for example, queue array $600_1$ within each of the CPUs 201A-201D includes a control queue 605 at column three and row three (i.e., starting from left most column 1 and topmost row 1) that corresponds to the third bank (R) within the third memory device (Y) of memory subsystem $203_1$. As another example, queue array $600_4$ within each of the CPUs includes a control queue 607 at column four, row one that corresponds to the first bank (P) within the fourth memory device (Z) of memory subsystem $203_4$. Note that a similar queue arrangement may be implemented with other types of memory access requestors. In one embodiment, as memory access requests are received (or generated, for example as part of program execution), the address values associated with the memory access requests are parsed to determine which memory subsystem 203, memory device 207, and memory bank 209 is to be accessed to carry out the request, and the appropriate command, address and data are queued therein. In the case of a memory write operation, write data may be queued along with the memory address and transferred to the target memory subsystem, memory device and memory bank in queued order. In a memory read operation, the returned read data may be queued in an outbound queue (e.g., part of or associated with the control queue which sourced the corresponding memory read command) or similar structure for return to an external requestor or other circuitry (e.g., core processing circuitry) within the host device.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A multi-chip package comprising:
   a logic integrated circuit (IC) die formed with plural memory controller circuits;
   a memory including a first memory IC die and a second memory IC die, the second memory IC die mounted to the first memory IC die, the first memory IC die and the logic IC die mounted to one another;
   wherein the logic IC die includes a serial link interface for coupling to multiple serial links;
   a crossbar switch coupled to the serial link interface of the logic IC die; and
   wherein the memory is partitioned into plural independently accessible memory groups and accessed concurrently via a corresponding logic circuit.

2. The multi-chip package of claim 1, wherein the serial link interface includes plural differential serial link ports for coupling to respective differential serial links.

3. The multi-chip package of claim 1, wherein the first and second memory IC die comprise DRAM IC die.

4. The multi-chip package of claim 1, wherein each independent memory group includes plural memory banks.

5. The multi-chip package of claim 1, wherein each memory IC die forms each independent memory group.

6. The multi-chip package of claim 1, wherein the plural memory controller circuits correspond to the plural memory groups, where each of the plural memory controller circuits separately controls a corresponding one of the memory groups.

7. The multi-chip package of claim 6, wherein each of the plural memory controller circuits separately controls a corresponding one of the memory groups during a first time interval, and a different memory group during a second time interval.

8. The multi-chip package of claim 6, wherein the crossbar switch selectively couples the plural memory controllers to the serial link interface.

9. The multi-chip package of claim 1, wherein the logic IC die is mounted on the first memory IC die.

10. A memory device comprising:
    a logic IC chip;
    memory including a first memory IC chip and a second memory IC chip, the first memory IC chip and the logic IC chip mounted to one another, and wherein the logic IC chip and the first and second memory IC chips are all disposed within a single IC package;
    wherein the logic IC chip includes
      plural serial link ports to communicate with a requestor,
      a memory interface including plural logic circuits,
    wherein the memory is partitioned into plural independently accessible memory groups and accessed concurrently via a corresponding logic circuit.

11. The memory device of claim 10, wherein the logic IC chip includes switch circuitry to switchably couple communication between a given partitioned group, and one or more of the serial link ports.

12. The memory device of claim 11, wherein the switch circuitry comprises a crossbar switch.

13. The memory device of claim 10, wherein each of the first and second memory IC chips defines a separate memory group.

14. The memory device of claim 10, wherein each of the partitioned memory groups include plural memory banks.

15. A method of operating a memory system having first and second memory IC chips forming a memory, and a logic IC chip formed with plural memory controllers, the logic IC chip and the first memory IC chip mounted to one another, and wherein the logic IC chip and the first and second memory IC chips are all disposed within a single IC package, the method comprising:
- partitioning the memory into memory groups, each memory group including plural memory banks;
- independently controlling each memory group with the plural memory controllers;
- accessing each of the independently controlled memory groups concurrently;
- interfacing the accessed memory groups with high-speed serial link ports; and
- transferring data to and from the memory groups via the high-speed serial link ports.

16. The method of claim 15, and further comprising:
- switchably coupling the memory groups to the plural controllers.

17. The method of claim 15, wherein independently controlling is during a given time interval.

18. The method of claim 17, wherein a given memory controller controls at least a portion of a first memory group during a first time interval, and at least a portion of a second memory group during a second time interval.

19. The method of claim 15, wherein transferring comprises differentially transferring.

* * * * *